(12) United States Patent
Kobayashi et al.

(10) Patent No.: US 8,968,857 B2
(45) Date of Patent: Mar. 3, 2015

(54) HIGH HARDNESS IMPRINT MATERIAL

(75) Inventors: Junpei Kobayashi, Funabashi (JP);
Taku Kato, Funabashi (JP); Keisuke Shuto, Funabashi (JP); Masayoshi Suzuki, Funabashi (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 84 days.

(21) Appl. No.: 13/391,934

(22) PCT Filed: Aug. 17, 2010

(86) PCT No.: PCT/JP2010/063872
§ 371 (c)(1),
(2), (4) Date: Feb. 23, 2012

(87) PCT Pub. No.: WO2011/024673
PCT Pub. Date: Mar. 3, 2011

(65) Prior Publication Data
US 2012/0148809 A1   Jun. 14, 2012

(30) Foreign Application Priority Data
Aug. 25, 2009   (JP) ................. 2009-194269

(51) Int. Cl.
  B32B 3/00      (2006.01)
  C09D 147/00    (2006.01)
  G03F 7/00      (2006.01)
  B82Y 10/00     (2011.01)
  B82Y 40/00     (2011.01)
  G02B 1/10      (2006.01)
  G03F 7/075     (2006.01)

(52) U.S. Cl.
  CPC ........... G03F 7/0002 (2013.01); B82Y 10/00 (2013.01); B82Y 40/00 (2013.01); G02B 1/105 (2013.01); G03F 7/0755 (2013.01)
  USPC ...................................... 428/195.1

(58) Field of Classification Search
  CPC .................................................. G03F 7/0002
  See application file for complete search history.

(56) References Cited

U.S. PATENT DOCUMENTS

| 5,772,905 A | 6/1998 | Chou | |
| 2006/0088257 A1* | 4/2006 | Maeda et al. | 385/102 |
| 2007/0269747 A1 | 11/2007 | Bahadur et al. | |
| 2008/0138741 A1* | 6/2008 | Beckley et al. | 430/281.1 |
| 2009/0263631 A1 | 10/2009 | Sakamoto et al. | |

FOREIGN PATENT DOCUMENTS

| JP | A-63-152037 | 6/1988 |
| JP | A-2007-72374 | 3/2007 |
| JP | A-2008-512281 | 4/2008 |
| JP | A-2008-105414 | 5/2008 |
| JP | A-2008-202022 | 9/2008 |
| JP | A-2009-73873 | 4/2009 |
| WO | WO 2007029542 A1 * | 3/2007 |

OTHER PUBLICATIONS

Sep. 21, 2010 International Search Report issued in International Patent Application No. PCT/JP2010/063872.
Sep. 21, 2010 Written Opinion of the International Searching Authority issued in International Patent Application No. PCT/JP2010/063872.

* cited by examiner

*Primary Examiner* — Mark Ruthkosky
*Assistant Examiner* — Ian Rummel
(74) *Attorney, Agent, or Firm* — Oliff PLC

(57) ABSTRACT

There is provided an imprint material from which a film having a high hardness can be formed. An imprint material comprising a component (A), a component (B) and a component (C), the component (A) being a compound having, in the molecule thereof, five or more polymerizable groups, the component (B) being a compound having, in the molecule thereof, two polymerizable groups, and the component (C) being a photo-radical generator.

10 Claims, No Drawings

HIGH HARDNESS IMPRINT MATERIAL

TECHNICAL FIELD

The present invention relates to an imprint material and a film which is prepared from the material and to which a pattern is transferred. More in detail, the present invention relates to an imprint material for forming a film having high hardness, high transparency, and crack resistance after baking thereof, and a film which is prepared from the material and to which a pattern is transferred.

BACKGROUND ART

In 1995, Professor Chou et al, presently of Princeton University put forward a novel technology called nanoimprint lithography (Patent Document 1). Nanoimprint lithography is a technology by a method including: contacting a mold having an arbitrary pattern with a base material in which a resin film is formed; and applying heat or light as an external stimulation to the resin film while pressurizing the resin film to form an objective pattern in the resin film that is cured, and nanoimprint lithography has such an advantage that in comparison with photolithography or the like in the conventional semiconductor device production, processing of nano-scale is possible simply and with low cost. Accordingly, nanoimprint lithography is a technology for which an application thereof to the production of a semiconductor device, an opto device, a display, a memory medium, a bio-chip, and the like is expected instead of photolithography technology, so that there have been performed various reports with respect to a curable composition for photonanoimprint lithography used for nanoimprint lithography (Patent Documents 2, 3).

However, although hitherto various materials have been disclosed as the material used for nanoimprint lithography (hereinafter, called "imprint material"), it cannot be mentioned that there has been reported an imprint material for forming a film imparting high hardness and high transparency useful for an optical member, an interlayer insulating film, and the like that have a structure and causing no crack after baking thereof.

RELATED-ART DOCUMENT

Patent Document

Patent Document 1: U.S. Pat. No. 5,772,905 Specification
Patent Document 2: Japanese Patent Application Publication No. JP-A-2008-105414
Patent Document 3: Japanese Patent Application Publication No. JP-A-2008-202022

SUMMARY OF THE INVENTION

Problem to be Solved by the Invention

The present invention has been invented for solving the above problems and the problem to be solved by the present invention is to provide an imprint material for forming a film having high hardness, high transparency, and crack resistance after baking thereof. It is also the problem to be solved by the present invention to provide a film which is prepared from the material and to which a pattern is transferred.

Specifically, with respect to the crack resistance after baking, it is an object to provide a material for forming a film in which no crack is observed when the film is quenched after baking thereof at 230° C.; with respect to the hardness, it is an object to provide a material for forming a film having, for example, a hardness of 3H or more as the pencil hardness; and with respect to the transparency, it is an object to provide a material for forming a film having a high transmittance of, for example, 98% or more.

Particularly, a characteristic of the present invention is to provide an imprint material for forming a film having the performance of satisfying all of various characteristics such as high hardness, high transparency, and crack resistance after baking thereof.

Here, in the present specification, a photonanoimprint technology including not only a case where the size of a formed pattern is of nanometer order, but also, for example, a case where the size of a formed pattern is of micrometer order, is called the photoimprint.

Means for Solving the Problem

As a result of assiduous research intended to overcome these problems, the inventors of the present invention have found that by making an imprint material contain a compound having, in the molecule thereof, five or more polymerizable groups and a compound having, in the molecule thereof, two polymerizable groups, a film formed from the imprint material has the performance of satisfying all of the above various characteristics, and have completed the present invention.

That is, the present invention is
an imprint material containing a component (A), a component (B), and a component (C).
Component (A): a compound having, in the molecule thereof, five or more polymerizable groups
Component (B): a compound having, in the molecule thereof, two polymerizable groups
Component (C): a photo-radical generator

Effects of the Invention

In the present invention, a compound having, in the molecule thereof, five or more polymerizable groups and a compound having, in the molecule thereof, two polymerizable groups are contained in an imprint material, so that a film which is prepared from the imprint material, and to which a pattern is transferred causes no crack after baking thereof and has high hardness and high transparency.

The imprint material of the present invention can be cured by light and the thus cured film causes no peeling of a part of a pattern during mold-release thereof, so that there can be obtained a film in which a desired pattern is exactly formed. Accordingly, an advantageous pattern formation of the photoimprint is possible.

The imprint material of the present invention can be film-formed on an arbitrary base material and a film formed after the imprint to which a pattern is transferred can be suitably applied to not only a reflection preventing member for an image display apparatus or a solar cell, a beam-condensing member for a solar cell, and an optical member such as an optical lens and an optical waveguide, but also an interlayer insulating film and/or a gate insulating film for a semiconductor device such as field effect transistor, a solid-state image sensor such as a CMOS image sensor, and an image display device such as an organic EL element. By using the imprint material of the present invention, for example, on the surface of a reflection preventing member, a moth eye structure can be formed.

Furthermore, by varying the type and the ratio of the compounds having polymerizable groups as the component (A) and the component (B), the curing rate, the dynamic viscosity, and the film thickness can be controlled. Accordingly, the imprint material of the present invention can design a material corresponding to the type of the device to be produced and the types of the exposing process and the baking process and can enlarge a process margin, so that the imprint material can suitably be applied to the production of an optical member.

MODES FOR CARRYING OUT THE INVENTION

The present invention has a characteristic in terms that by using a compound having, in the molecule thereof, five or more polymerizable groups and a compound having, in the molecule thereof, two polymerizable groups, the crack resistance of a film formed from an imprint material containing these compounds after baking thereof is enhanced, and simultaneously, properties such as high hardness and high transparency are imparted to the film. That is, the imprint material of the present invention is an imprint material containing "a compound having, in the molecule thereof, five or more polymerizable groups" as the component (A), "a compound having, in the molecule thereof, two polymerizable groups" as the component (B), and "a photo-radical generator" as the component (C). Furthermore, the imprint material of the present invention is an imprint material capable of containing, in addition to the component (A), the component (B), and the component (C), also a solvent as a component (D) and a silicone compound having, in the molecule thereof, two or more polymerizable groups as a component (E).

Hereinafter, each component is described in detail.

<Component (A)>

The "compound having, in the molecule thereof, five or more polymerizable groups" as the component (A) is a compound which has, in one molecule thereof, five or more polymerizable groups, in which the polymerizable group is in a molecular terminal and there is no Si—O—Si bond, and which may be a mixture of the compounds. Five or more polymerizable groups are, for example, five to six polymerizable groups. The polymerizable group refers to, for example, at least one type of organic group selected from the group consisting of an acryloyloxy group, a methacryloyloxy group, a vinyl group, and an allyl group. Here, the acryloyloxy group may be expressed as an acryloxy group and the methacryloyloxy group may be expressed as a methacryloxy group.

Examples of the compound having, in the molecule thereof, five or more polymerizable groups that is the component (A) include dipentaerythritol hexaacrylate, dipentaerythritol hexamethacrylate, dipentaerythritol pentaacrylate, and dipentaerythritol pentamethacrylate.

The compound having, in the molecule thereof, five or more polymerizable groups is commercially available and specific examples thereof include KAYARAD (registered trademark) DPHA, KAYARAD D-310, KAYARAD DPCA-20, KAYARAD DPCA-30, KAYARAD DPCA-60, and KAYARAD DPCA-120 (up to here, manufactured by Nippon Kayaku Co., Ltd.), Aronix (registered trademark) M-400, Aronix M-402, Aronix M-403, Aronix M-404, Aronix M-405, and Aronix M-406 (up to here, manufactured by TOAGOSEI Co., Ltd.), and A-DPH (manufactured by Shin-Nakamura Chemical Co., Ltd.).

The compounds having, in the molecule thereof, five or more polymerizable groups may be used individually or in combination of two or more types thereof.

The component (A) of the present invention can impart hardness to a film formed from an imprint material containing the component (A) and the content of the component (A) is preferably 10 to 30 parts by mass, relative to 100 parts by mass of the total of the component (A) and the below-described component (B). When the ratio is excessively small, the hardness of the film lowers and when the ratio is excessively large, crack is caused after baking of the film, so that the objective physical properties of the film become difficult to be obtained.

<Component (B)>

The "compound having, in the molecule thereof, two polymerizable groups" as the component (B) is a compound which has, in one molecule thereof, two polymerizable groups, in which the polymerizable group is in a molecular terminal and there is no Si—O—Si bond, and which may be a mixture of the compounds. The polymerizable group refers to, for example, at least one type of organic group selected from the group consisting of an acryloyloxy group, a methacryloyloxy group, a vinyl group, and an allyl group.

Examples of the compound having, in the molecule thereof, two polymerizable groups that is the component (B) include neopentyl glycol diacrylate, neopentyl glycol dimethacrylate, ethanediol diacrylate, ethanediol dimethacrylate, 2-hydroxypropanediol diacrylate, 2-hydroxypropanediol dimethacrylate, diethylene glycol diacrylate, diethylene glycol dimethacrylate, isopropylene glycol diacrylate, isopropylene glycol dimethacrylate, triethylene glycol diacrylate, triethylene glycol dimethacrylate, N,N'-bis(acryloyl) cysteine, N,N'-bis(methacryloyl) cysteine, thiodiglycol diacrylate, thiodiglycol dimethacrylate, bisphenol A diacrylate, bisphenol F diacrylate, bisphenol S diacrylate, bisphenoxyethanol fluorene dimethacrylate, diallyl ether bisphenol A, o-diallyl bisphenol A, and diallyl maleate.

The compound having, in the molecule thereof, two polymerizable groups is commercially available and specific examples thereof include KAYARAD (registered trademark) R-526, KAYARAD NPGDA, KAYARAD PEG400DA, KAYARAD MANDA, KAYARAD R-167, KAYARAD HX-220, KAYARAD HX-620, KAYARAD R-551, KAYARAD R-712, KAYARAD R-604, and KAYARAD R-684 (up to here, manufactured by Nippon Kayaku Co., Ltd.), Aronix (registered trademark) M-203S, Aronix M-208, Aronix M-211B, Aronix M-215, Aronix M-220, Aronix M-225, Aronix M-270, and Aronix M-240 (up to here, manufactured by TOAGOSEI Co., Ltd.), Viscoat 195, Viscoat 230, Viscoat 260, Viscoat 265, Viscoat 310HP, Viscoat 335, and Viscoat 700 (up to here, manufactured by Osaka Organic Chemical Industry, Ltd.), and A-200, A-400, A-600, A-1000, ABE-300, A-BPE-4, A-BPE-10, A-BPE-20, A-BPP-3, A-DOD, DOD-N, A-DCP, A-IBD-2E, A-NPG, 701A, A-B1206PE, A-HD-N, APG-100, APG-200, APG-400, APG-700, 1G, 2G, 3G, 4G, 9G, 14G, 23G, BD, BG, HD-N, NOD, IND, BPE-100, BPE-200, BPE-300, BPE-500, BPE-900, BPE-1300N, NPG, DCP, 1206PE, 701, 3PG, and 9PG (up to here, manufactured by Shin-Nakamura Chemical Co., Ltd.).

The compounds having, in the molecule thereof, two polymerizable groups may be used individually or in combination of two or more types thereof.

The component (B) of the present invention can impart crack resistance to a film formed from an imprint material containing the component (B) and the content of the component (B) is preferably 90 to 70 parts by mass, relative to 100 parts by mass of the total of the component (A) and the component (B). When the ratio is excessively small, crack is caused after baking of the film and when the ratio is excessively large, the hardness of the film lowers, so that the objective physical properties of the film become difficult to be obtained.

<Component (C)>

Examples of the photo-radical generator that is the component (C) include organic peroxides such as tert-butylperoxy-iso-butyrate, 2,5-dimethyl-2,5-bis(benzoyldioxy)hexane, 1,4-bis[α-(tert-butyldioxy)-iso-propoxy]benzene, di-tert-butylperoxide, 2,5-dimethyl-2,5-bis(tert-butyldioxy) hexene hydroperoxide, α-(iso-propylphenyl)-iso-propylhydroperoxide, 2,5-dimethylhexane, tert-butylhydroperoxide, 1,1-bis(tert-butyldioxy)-3,3,5-trimethylcyclohexane, butyl-4,4-bis(tert-butyldioxy)valerate, cyclohexanone peroxide, 2,2',5,5'-tetra(tert-butylperoxycarbonyl)benzophenone, 3,3',4,4'-tetra(tert-butylperoxycarbonyl)benzophenone, 3,3',4,4'-tetra(tert-amylperoxycarbonyl)benzophenone, 3,3',4,4'-tetra(tert-hexylperoxycarbonyl)benzophenone, 3,3'-bis(tert-butylperoxycarbonyl)-4,4'-dicarboxy benzophenone, tert-butylperoxy benzoate, and di-tert-butyldiperoxy isophthalate; quinones such as 9,10-anthraquinone, 1-chloroanthraquinone, 2-chloroanthraquinone, octamethylanthraquinone, and 1,2-benzanthraquinone; benzoin derivatives such as benzoin methyl, benzoin ethyl ether, α-methylbenzoin, and α-phenylbenzoin; 2,2-dimethoxy-1,2-diphenylethane-1-one; 1-hydroxy-cyclohexyl-phenyl-ketone; 2-hydroxy-2-methyl-1-phenyl-propane-1-one; 1-[4-(2-hydroxyethoxy)-phenyl]-2-hydroxy-2-methyl-1-propane-1-one; 2-hydroxy-1-[4-{4-(2-hydroxy-2-methyl-propionyl) benzyl}-phenyl]-2-methyl-propane-1-one; phenylglyoxylic acid methyl ester; 2-methyl-1-[4-(methylthio)phenyl]-2-morpholinopropane-1-one; 2-benzyl-2-dimethylamino-1-(4-morpholinophenyl)-butanone-1,2-dimethylamino-2-(4-ethyl-benzyl)-1-(4-morpholine-4-yl-phenyl)-butane-1-one; bis(2,4,6-trimethylbenzoyl)-phenylphosphine oxide; 2,4,6-trimethylbenzoyl-diphenyl-phosphine oxide; 1,2-octanedione, 1-[4-(phenylthio)-, 2-(o-benzoyloxime)]; and ethanone, 1-[9-ethyl-6-(2-methylbenzoyl)-9H-carbazole-3-yl]-, 1-(o-acetyloxime). However, the photo-radical generator is not particularly limited so long as the photo-radical generator has absorption relative to a light source used for photocuring.

The photo-radical generator is commercially available and specific examples thereof include IRGACURE (registered trademark) 651, IRGACURE 184, IRGACURE 500, IRGACURE 2959, IRGACURE 127, IRGACURE 754, IRGACURE 907, IRGACURE 369, IRGACURE 379, IRGACURE 379EG, IRGACURE 819, IRGACURE 819DW, IRGACURE 1800, IRGACURE 1870, IRGACURE 784, IRGACURE OXE01, IRGACURE OXE02, and IRGACURE 250, DAROCUR (registered trademark) 1173, DAROCUR MBF, DAROCUR TPO, and DAROCUR 4265 (up to here, manufactured by BASF Japan Ltd. (former: Ciba Japan K.K.)), KAYACURE (registered trademark) DETX, KAYACURE MBP, KAYACURE DMBI, KAYACURE EPA, and KAYACURE OA (up to here, manufactured by Nippon Kayaku Co., Ltd.), VICURE-10 and VICURE-55 (up to here, manufactured by STAUFFER Co., Ltd.), ESACURE KIP150, ESACURE TZT, ESACURE 1001, ESACURE KTO46, ESACURE KB1, ESACURE KL200, ESACURE KS300, and ESACURE EB3, Triazine-PMS, Triazine A, and Triazine B (up to here, manufactured by Nihon SiberHegner K.K.), and Adeka Optomer-N-1717, Adeka Optomer-N-1414, and Adeka Optomer-N-1606 (manufactured by Adeka Corporation (former: Asahi Denka Co., Ltd.)).

The photo-radical generators may be used individually or in combination of two or more types thereof.

The content of the component (C) in the imprint material of the present invention is preferably 0.5 phr to 30 phr, more preferably 1 phr to 20 phr, based on the total mass of the component (A) and the component (B). This is because, when the ratio is 0.1 phr or less, satisfactory curability of the film cannot be obtained and there are caused impairment of patterning characteristic and lowering of the hardness of a film formed from the imprint material. Here, phr means the mass of the photo-radical generator, relative to 100 g of the total mass of the component (A) and the component (B).

<Component (D)>

In the present invention, the imprint material may contain a solvent as the component (D).

A solvent that is the component (D) plays a role of adjusting the viscosity of the compound which has, in the molecule thereof, five or more polymerizable groups and which is the component (A).

Examples of the solvent include toluene, p-xylene, o-xylene, styrene, ethylene glycol dimethyl ether, propylene glycol monomethyl ether, ethylene glycol monomethyl ether, propylene glycol, propylene glycol monoethyl ether, ethylene glycol monoethyl ether, ethylene glycol monoisopropyl ether, ethylene glycol methyl ether acetate, propylene glycol monomethyl ether acetate, ethylene glycol ethyl ether acetate, diethylene glycol dimethyl ether, propylene glycol monobutyl ether, ethylene glycol monobutyl ether, diethylene glycol diethyl ether, dipropylene glycol monomethyl ether, diethylene glycol monomethyl ether, dipropylene glycol monoethyl ether, diethylene glycol monoethyl ether, triethylene glycol dimethyl ether, diethylene glycol monoethyl ether acetate, diethylene glycol, 1-octanol, ethylene glycol, hexylene glycol, diacetone alcohol, furfuryl alcohol, tetrahydrofurfuryl alcohol, benzyl alcohol, 1,3-butanediol, 1,4-butanediol, 2,3-butanediol, γ-butyrolactone, acetone, methyl ethyl ketone, methyl isopropyl ketone, diethyl ketone, methyl isobutyl ketone, methyl n-butyl ketone, cyclohexanone, 2-heptanone, ethyl acetate, isopropyl acetate, n-propyl acetate, isobutyl acetate, n-butyl acetate, ethyl lactate, methanol, ethanol, isopropanol, tert-butanol, allyl alcohol, n-propanol, 2-methyl-2-butanol, isobutanol, n-butanol, 2-methyl-1-butanol, 1-pentanol, 2-methyl-1-pentanol, 2-ethylhexanol, 1-octanol, ethylene glycol, hexylene glycol, trimethylene glycol, 1-methoxy-2-butanol, tetrahydrofurfuryl alcohol, propylene glycol, benzyl alcohol, isopropyl ether, 1,4-dioxane, N,N-dimethylformamide, N,N-dimethylacetamide, N-methylpyrrolidone, 1,3-dimethyl-2-imidazolidinone, dimethylsulfoxide, and N-cyclohexyl-2-pyrrolidine. The solvent is not particularly limited so long as the solvent can adjust the viscosity of the component (A).

However, from the viewpoint of the compatibility of the solvent with the compound having, in the molecule thereof, five or more polymerizable groups, the compound having, in the molecule thereof, two polymerizable groups, and the photo-radical generator, the solvent is preferably propylene glycol monomethyl ether acetate, propylene glycol monomethyl ether, γ-butyrolactone, N-methylpyrrolidone, methanol, ethanol, isopropanol, butanol, diacetone alcohol, acetone, methyl ethyl ketone, methyl isobutyl ketone, ethylene glycol, propylene glycol, hexylene glycol, methyl cellosolve, ethyl cellosolve, butyl cellosolve, ethyl carbitol, butyl carbitol, diethylene glycol monomethyl ether, propylene glycol monobutyl ether, cyclohexanone, acetic acid methyl ester, acetic acid ethyl ester, or the like.

These solvents may be used individually or in combination of two or more types thereof.

<Component (E)>

In the present invention, the imprint material may contain, as the component (E), a silicone compound having, in the molecule thereof, two or more polymerizable groups.

The "silicone compound having, in the molecule thereof, two or more polymerizable groups" as the component (E) is a compound that is a polymer or oligomer. The compound has, in one molecule thereof, two or more polymerizable groups, has, in the backbone thereof, a Si—O—Si bond (siloxane bond), and may be a mixture of the compounds. The polymerizable group refers to, for example, at least one type of organic group selected from the group consisting of an acryloyloxy group, a methacryloyloxy group, a vinyl group, and an allyl group.

The silicone compound having, in the molecule thereof, two or more polymerizable groups is commercially available and specific examples thereof include X-22-164, X-22-164AS, X-22-164A, X-22-164B, X-22-164C, and X-22-164E (up to here, manufactured by Shin-Etsu Chemical Co., Ltd.), and BYK (registered trademark)-UV3570, BYK-UV3500, and BYK-UV3510 (up to here, manufactured by BYK Japan KK).

The silicone compounds having, in the molecule thereof, two or more polymerizable groups may be used individually or in combination of two or more types thereof.

The component (E) of the present invention can impart resistance against peeling from a base material to a film formed from an imprint material containing the component (E) during the immersion of the film in a solvent and the content thereof is preferably 1 to 20 part(s) by mass, more preferably 3 parts by mass or more, relative to 100 parts by mass of the total of the component (A) and the component (B). When the ratio is excessively small, the resistance against peeling lowers and when the ratio is excessively large, the hardness of the film lowers, so that the objective physical properties become difficult to be obtained.

The imprint material of the present invention may contain, so long as the effect of the present invention is not impaired and if necessary, a photosensitizer, an ultraviolet absorber, an antioxidant, a surfactant, an adhesion assistant, and the like.

Examples of the photosensitizer include a thioxanthene-based, a xanthene-based, a ketone-based, a thiopyrylium salt-based, a base styryl-based, a merocyanine-based, a 3-substituted coumarin-based, a 3,4-substituted coumarin-based, a cyanine-based, an acridine-based, a thiazine-based, a phenothiazine-based, an anthracene-based, a coronene-based, a benzanthracene-based, a perylene-based, a ketocoumarin-based, a coumarin-based, and a borate-based.

The photosensitizers may be used individually or in combination of two or more types thereof. By using the photosensitizer, the wavelength in a UV region can also be controlled.

Examples of the ultraviolet absorber include TINUVIN (registered trademark) PS, TINUVIN 99-2, TINUVIN 109, TINUVIN 328, TINUVIN 384-2, TINUVIN 400, TINUVIN 405, TINUVIN 460, TINUVIN 477, TINUVIN 479, TINUVIN 900, TINUVIN 928, TINUVIN 1130, TINUVIN 111FDL, TINUVIN 123, TINUVIN 144, TINUVIN 152, TINUVIN 292, TINUVIN 5100, TINUVIN 400-DW, TINUVIN 477-DW, TINUVIN 99-DW, TINUVIN 123-DW, TINUVIN 5050, TINUVIN 5060, and TINUVIN 5151 (up to here, manufactured by BASF Japan Ltd. (former: Ciba Japan K.K.)).

The ultraviolet absorbers may be used individually or in combination of two or more types thereof. By using the ultraviolet absorber, during photocuring, the curing rate of the outermost surface of a film formed from the imprint material can be controlled and the mold-release property of the film may be enhanced.

Examples of the antioxidant include IRGANOX (registered trademark) 1010, IRGANOX 1035, IRGANOX 1076, IRGANOX 1135, and IRGANOX 1520L (up to here, manufactured by BASF Japan Ltd. (former: Ciba Japan K.K.)).

The antioxidants may be used individually or in combination of two or more types thereof. By using the antioxidant, a film formed from the imprint material can be prevented from being discolored into yellow by oxidation.

Examples of the surfactant include: nonionic surfactants, for example polyoxyethylene alkyl ethers such as polyoxyethylene lauryl ether, polyoxyethylene stearyl ether, polyoxyethylene acetyl ether, and polyoxyethylene oleyl ether, polyoxyethylene alkylaryl ethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorinated surfactants, for example EFTOP (registered trademark) EF301, EFTOP EF303, and EFTOP EF352 (trade name; manufactured by Mitsubishi Materials Electronic Chemicals Co., Ltd. (former: Jemco Inc.)), MEGAFAC (registered trademark) F171, MEGAFAC F173, MEGAFAC R-08, and MEGAFAC R-30 (trade name; manufactured by DIC Corporation), Fluorad FC430 and FC431 (manufactured by Sumitomo 3M Limited), AsahiGuard (registered trademark) AG710 and Surflon (registered trademark) S-382, Surflon SC101, Surflon SC102, Surflon SC103, Surflon SC104, Surflon SC105, and Surflon SC106 (trade name; manufactured by Asahi Glass Co., Ltd.); and Organosiloxane polymer KP341 (manufactured by Shin-Etsu Chemical Co., Ltd.), and BYK (registered trademark)-302, BYK-307, BYK-322, BYK-323, BYK-330, BYK-333, BYK-370, BYK-375, and BYK-378 (manufactured by BYK Japan KK).

The surfactants may be used individually or in combination of two or more types thereof. When the surfactant is used, the ratio thereof is preferably 0.01 phr to 10 phr, more preferably 0.01 phr to 5 phr, based on the total mass of the component (A) and the component (B).

Examples of the adhesion assistant include 3-methacryloxypropyltrimethoxysilane and 3-acryloxypropyltrimethoxysilane. By using the adhesion assistant, the adhesion to a base material is enhanced. The content of the adhesion assistant is preferably 5 phr to 50 phr, more preferably 10 phr to 50 phr, based on the total mass of the component (A) and the component (B).

Although the preparation method of the imprint material of the present invention is not particularly limited, it is satisfactory when a state in which the component (A), the component (B), the component (C), and the component (D) and/or the component (E) are homogeneously mixed is prepared. The order of mixing the component (A) to the component (E) is not particularly limited and there is no problem so long as a homogeneous solution can be obtained. Examples of the preparation method include a method of mixing the component (B) and the component (C) with the component (A) each in a predetermined ratio. Examples of the preparation method include also a method of mixing further the component (D) and/or the component (E) with the mixture of the component (A) to the component (C) to prepare a homogeneous solution. Examples of the preparation method include further a method of adding, if necessary, further other additives to the above mixtures to be mixed in an appropriate stage of the above preparation methods.

When the solvent that is the component (D) is used, at least any one of the coating film before light-irradiation and the coating film after light-irradiation may be subjected to baking for the purpose of evaporating the solvent. The apparatus for baking is not particularly limited and examples of the apparatus include apparatuses capable of baking the coating film in an appropriate atmosphere, that is, the atmosphere, an inert gas such as nitrogen, and vacuum, using, for example, a hot plate, an oven, and a furnace. Although the baking temperature for the purpose of evaporating the solvent is not particularly limited, examples thereof include 40° C. to 200° C.

By coating a base material with the imprint material of the present invention, photocuring the resultant coating film, and then heating the cured coating film, a desired coating film can be obtained. Examples of the coating method include publicly known or well-known methods such as a spin coating method, a dipping method, a flow coating method, an inkjet method, a spraying method, a bar coating method, a gravure coating method, a slit coating method, a roll coating method, a transfer printing method, a brush coating method, a blade coating method, and an air-knife coating method.

Examples of the base material for being coated with the imprint material of the present invention include base materials including silicon, a glass on which indium tin oxide (ITO) is film-formed (hereinafter, abbreviated as "ITO substrate"), a glass on which silicon nitride (SiN) is film-formed, a glass on which indium zinc oxide (IZO) is film-formed, polyethyleneterephthalate (PET), triacetylcellulose (TAC), acryl, plastic, glass, quartz, ceramic, and the like. It is also possible to use a flexible base material having flexibility.

Although the light source for curing the imprint material of the present invention is not particularly limited, examples thereof include a high pressure mercury lamp, a low pressure mercury lamp, a metal halide lamp, a KrF excimer laser, an ArF excimer laser, a $F_2$ excimer laser, an electron beam (EB), and an extreme ultraviolet ray (EUV), As the wavelength, there can be generally used a G ray of 436 nm, an H ray of 405 nm, an I ray of 365 nm, or a GHI mixed ray. The exposure value is preferably 30 to 2,000 mJ/cm$^2$, more preferably 30 to 1,000 mJ/cm$^2$.

Although the apparatus for performing the photoimprint is not particularly limited so long as the objective pattern can be obtained, examples thereof include commercially available apparatuses such as ST50 (manufactured by Toshiba Machine Co., Ltd.), Sindre (registered trademark) 60 (manufactured by Obducat AB), and NM-0801HB (manufactured by Meisyo Kiko Co., Ltd.).

Although examples of the mold material used for the photoimprint used in the present invention include quartz, silicon, nickel, carbonyl silane, and glassy carbon, the mold material is not particularly limited so long as the objective pattern can be obtained. The mold may be subjected to mold release treatment by which, on the surface of the mold, a thin film of a fluorine-based compound or the like is formed for enhancing the mold-release property of the mold. Although examples of the mold-release agent used for the mold-release treatment include OPTOOL (registered trademark) HD (manufactured by Daikin Industries, Ltd.), the mold-release agent is not particularly limited so long as the objective pattern can be obtained.

As the pattern of the photoimprint, a pattern adapted to an objective electronic device may be selected and the pattern size accords thereto. The pattern size is, for example, of nanometer order or micrometer order.

EXAMPLES

Hereinafter, the present invention is described more in detail referring to Examples and Comparative Examples, which should not be construed as limiting the scope of the present invention.

[Preparation of Coating Liquid for Forming Coating Film]

Example 1

To 3 g of KAYARAD (registered trademark) DPHA (manufactured by Nippon Kayaku Co., Ltd.) (hereinafter, abbreviated as "DPHA"), 7 g of KAYARAD (registered trademark) neopentyl glycol diacrylate (manufactured by Nippon Kayaku Co., Ltd.) (hereinafter, abbreviated as "NPGDA") (70 parts by mass in 100 parts by mass of the total of DPHA and NPGDA) and 0.5 g of IRGACURE (registered trademark) OXE01 (manufactured by BASF Japan Ltd. (former: Ciba Japan K.K.)) (hereinafter, abbreviated as "OXE01") (5 phr, based on the total mass of DPHA and NPGDA) were added to prepare an imprint material PNI-01.

Example 2

To 2 g of DPHA, 8 g of NPGDA (80 parts by mass in 100 parts by mass of the total of DPHA and NPGDA) and 0.5 g of OXE01 (5 phr, based on the total mass of DPHA and NPGDA) were added to prepare an imprint material PNI-02.

Example 3

To 1 g of DPHA, 9 g of NPGDA (90 parts by mass in 100 parts by mass of the total of DPHA and NPGDA) and 0.5 g of OXE01 (5 phr, based on the total mass of DPHA and NPGDA) were added to prepare an imprint material PNI-03.

Example 4

In the same manner as in Example 1, except that NPGDA used in Example 1 was changed to 1G (manufactured by Shin-Nakamura Chemical Co., Ltd.) having two methacryloyloxy groups (hereinafter, abbreviated as "1G"), an imprint material PNI-04 was prepared.

Example 5

In the same manner as in Example 2, except that NPGDA used in Example 2 was changed to 1G, an imprint material PNI-05 was prepared.

Example 6

In the same manner as in Example 3, except that NPGDA used in Example 3 was changed to 1G, an imprint material PNI-06 was prepared.

Example 7

In the same manner as in Example 1, except that DPHA used in Example 1 was changed to A-DPH (manufactured by Shin-Nakamura Chemical Co., Ltd.) (hereinafter, abbreviated as "A-DPH"), an imprint material PNI-07 was prepared.

Example 8

In the same manner as in Example 2, except that DPHA used in Example 2 was changed to A-DPH, an imprint material PNI-08 was prepared.

Example 9

In the same manner as in Example 3, except that DPHA used in Example 3 was changed to A-DPH, an imprint material PNI-09 was prepared.

Example 10

In the same manner as in Example 1, except that DPHA and NPGDA used in Example 1 was changed to A-DPH and 1G respectively, an imprint material PNI-10 was prepared.

Example 11

In the same manner as in Example 2, except that DPHA and NPGDA used in Example 2 was changed to A-DPH and 1G respectively, an imprint material PNI-11 was prepared.

Example 12

In the same manner as in Example 3, except that DPHA and NPGDA used in Example 3 was changed to A-DPH and 1G respectively, an imprint material PNI-12 was prepared.

Example 13

To the imprint material PNI-01 obtained in Example 1, 2.6 g of propylene glycol monomethyl ether acetate (hereinafter, abbreviated as "PGMEA") was added to prepare an imprint material PNI-13.

Example 14

To the imprint material PNI-02 obtained in Example 2, 2.6 g of PGMEA was added to prepare an imprint material PNI-14.

Example 15

To the imprint material PNI-03 obtained in Example 3, 2.6 g of PGMEA was added to prepare an imprint material PNI-15.

Example 16

To the imprint material PNI-04 obtained in Example 4, 2.6 g of PGMEA was added to prepare an imprint material PNI-16.

Example 17

To the imprint material PNI-05 obtained in Example 5, 2.6 g of PGMEA was added to prepare an imprint material PNI-17.

Example 18

To the imprint material PNI-06 obtained in Example 6, 2.6 g of PGMEA was added to prepare an imprint material PNI-18.

Example 19

To the imprint material PNI-07 obtained in Example 7, 2.6 g of PGMEA was added to prepare an imprint material PNI-19.

Example 20

To the imprint material PNI-08 obtained in Example 8, 2.6 g of PGMEA was added to prepare an imprint material PNI-20.

Example 21

To the imprint material PNI-09 obtained in Example 9, 2.6 g of PGMEA was added to prepare an imprint material PNI-21.

Example 22

To the imprint material PNI-10 obtained in Example 10, 2.6 g of PGMEA was added to prepare an imprint material PNI-22.

Example 23

To the imprint material PNI-11 obtained in Example 11, 2.6 g of PGMEA was added to prepare an imprint material PNI-23.

Example 24

To the imprint material PNI-12 obtained in Example 12, 2.6 g of PGMEA was added to prepare an imprint material PNI-24.

Example 25

To PNI-01 obtained in Example 1, 0.5 g of X-22-164 (manufactured by Shin-Etsu Chemical Co., Ltd.) that is the component (E) (5 parts by mass in 100 parts by mass of the total of DPHA and NPGDA) was added to prepare an imprint material PNI-25.

Example 26

In the same manner as in Example 25, except that X-22-164 used in Example 25 was changed to BYK (registered trademark)-UV3570 (manufactured by BYK Japan KK), an imprint material PNI-26 was prepared.

Example 27

In the same manner as in Example 25, except that X-22-164 used in Example 25 was changed to BYK (registered trademark)-UV3500 (manufactured by BYK Japan KK), an imprint material PNI-27 was prepared.

Comparative Example 1

To 10 g of DPHA, 0.5 g of OXE01 (5 phr relative to DPHA) was added to prepare an imprint material PNI-A.

Comparative Example 2

To 10 g of A-DPH, 0.5 g of OXE01 (5 phr relative to A-DPH) was added to prepare an imprint material PNI-B.

Comparative Example 3

To 10 g of NPGDA, 0.5 g of OXE01 (5 phr relative to NPGDA) was added to prepare an imprint material PNI-C.

Comparative Example 4

To 10 g of 1G, 0.5 g of OXE01 (5 phr relative to 1G) was added to prepare an imprint material PNI-D.

Comparative Example 5

To the imprint material PNI-A obtained in Comparative Example 1, 2.6 g of PGMEA was added to prepare an imprint material PNI-E.

Comparative Example 6

To the imprint material PNI-B obtained in Comparative Example 2, 2.6 g of PGMEA was added to prepare an imprint material PNI-F.

Comparative Example 7

To the imprint material PNI-C obtained in Comparative Example 3, 2.6 g of PGMEA was added to prepare an imprint material PNI-G.

Comparative Example 8

To the imprint material PNI-C obtained in Comparative Example 4, 2.6 g of PGMEA was added to prepare an imprint material PNI-H.

[Preparation of Coating Film for Photoimprint]

A quartz substrate was spin-coated with the imprint material PNI-01 obtained in Example 1 to obtain a coating film (PNI-01F) for the photoimprint.

A quartz substrate was spin-coated with the imprint material PNI-02 obtained in Example 2 to obtain a coating film (PNI-02F) for the photoimprint.

A quartz substrate was spin-coated with the imprint material PNI-03 obtained in Example 3 to obtain a coating film (PNI-03F) for the photoimprint.

A quartz substrate was spin-coated with the imprint material PNI-04 obtained in Example 4 to obtain a coating film (PNI-04F) for the photoimprint.

A quartz substrate was spin-coated with the imprint material PNI-05 obtained in Example 5 to obtain a coating film (PNI-05F) for the photoimprint.

A quartz substrate was spin-coated with the imprint material PNI-06 obtained in Example 6 to obtain a coating film (PNI-06F) for the photoimprint.

A quartz substrate was spin-coated with the imprint material PNI-07 obtained in Example 7 to obtain a coating film (PNI-07F) for the photoimprint.

A quartz substrate was spin-coated with the imprint material PNI-08 obtained in Example 8 to obtain a coating film (PNI-08F) for the photoimprint.

A quartz substrate was spin-coated with the imprint material PNI-09 obtained in Example 9 to obtain a coating film (PNI-09F) for the photoimprint.

A quartz substrate was spin-coated with the imprint material PNI-10 obtained in Example 10 to obtain a coating film (PNI-10F) for the photoimprint.

A quartz substrate was spin-coated with the imprint material PNI-11 obtained in Example 11 to obtain a coating film (PNI-11F) for the photoimprint.

A quartz substrate was spin-coated with the imprint material PNI-12 obtained in Example 12 to obtain a coating film (PNI-12F) for the photoimprint.

A quartz substrate was spin-coated with the imprint material PNI-13 obtained in Example 13 and the resultant coating film was subjected to temporary baking on a hot plate of 100° C. for 1 minute to obtain a coating film (PNI-13F) for the photoimprint.

A quartz substrate was spin-coated with the imprint material PNI-14 obtained in Example 14 and the resultant coating film was subjected to temporary baking on a hot plate of 100° C. for 1 minute to obtain a coating film (PNI-14F) for the photoimprint.

A quartz substrate was spin-coated with the imprint material PNI-15 obtained in Example 15 and the resultant coating film was subjected to temporary baking on a hot plate of 100° C. for 1 minute to obtain a coating film (PNI-15F) for the photoimprint.

A quartz substrate was spin-coated with the imprint material PNI-16 obtained in Example 16 and the resultant coating film was subjected to temporary baking on a hot plate of 100° C. for 1 minute to obtain a coating film (PNI-16F) for the photoimprint.

A quartz substrate was spin-coated with the imprint material PNI-17 obtained in Example 17 and the resultant coating film was subjected to temporary baking on a hot plate of 100° C. for 1 minute to obtain a coating film (PNI-17F) for the photoimprint.

A quartz substrate was spin-coated with the imprint material PNI-18 obtained in Example 18 and the resultant coating film was subjected to temporary baking on a hot plate of 100° C. for 1 minute to obtain a coating film (PNI-18F) for the photoimprint.

A quartz substrate was spin-coated with the imprint material PNI-19 obtained in Example 19 and the resultant coating film was subjected to temporary baking on a hot plate of 100° C. for 1 minute to obtain a coating film (PNI-19F) for the photoimprint.

A quartz substrate was spin-coated with the imprint material PNI-20 obtained in Example 20 and the resultant coating film was subjected to temporary baking on a hot plate of 100° C. for 1 minute to obtain a coating film (PNI-20F) for the photoimprint.

A quartz substrate was spin-coated with the imprint material PNI-21 obtained in Example 21 and the resultant coating film was subjected to temporary baking on a hot plate of 100° C. for 1 minute to obtain a coating film (PNI-21F) for the photoimprint.

A quartz substrate was spin-coated with the imprint material PNI-22 obtained in Example 22 and the resultant coating film was subjected to temporary baking on a hot plate of 100° C. for 1 minute to obtain a coating film (PNI-22F) for the photoimprint.

A quartz substrate was spin-coated with the imprint material PNI-23 obtained in Example 23 and the resultant coating film was subjected to temporary baking on a hot plate of 100° C. for 1 minute to obtain a coating film (PNI-23F) for the photoimprint.

A quartz substrate was spin-coated with the imprint material PNI-24 obtained in Example 24 and the resultant coating film was subjected to temporary baking on a hot plate of 100° C. for 1 minute to obtain a coating film (PNI-24F) for the photoimprint.

A quartz substrate was spin-coated with the imprint material PNI-25 obtained in Example 25 to obtain a coating film (PNI-25F) for the photoimprint.

A quartz substrate was spin-coated with the imprint material PNI-26 obtained in Example 26 to obtain a coating film (PNI-26F) for the photoimprint.

A quartz substrate was spin-coated with the imprint material PNI-27 obtained in Example 27 to obtain a coating film (PNI-27F) for the photoimprint.

A quartz substrate was spin-coated with the imprint material PNI-A obtained in Comparative Example 1 to obtain a coating film (PNI-AF) for the photoimprint.

A quartz substrate was spin-coated with the imprint material PNI-B obtained in Comparative Example 2 to obtain a coating film (PNI-BF) for the photoimprint.

A quartz substrate was spin-coated with the imprint material PNI-C obtained in Comparative Example 3 to obtain a coating film (PNI-CF) for the photoimprint.

A quartz substrate was spin-coated with the imprint material PNI-D obtained in Comparative Example 4 to obtain a coating film (PNI-DF) for the photoimprint.

A quartz substrate was spin-coated with the imprint material PNI-E obtained in Comparative Example 5 and the resultant coating film was subjected to temporary baking on a hot plate of 100° C. for 1 minute to obtain a coating film (PNI-EF) for the photoimprint.

A quartz substrate was spin-coated with the imprint material PNI-F obtained in Comparative Example 6 and the resultant coating film was subjected to temporary baking on a hot plate of 100° C. for 1 minute to obtain a coating film (PNI-FF) for the photoimprint.

A quartz substrate was spin-coated with the imprint material PNI-G obtained in Comparative Example 7 and the resultant coating film was subjected to temporary baking on a hot plate of 100° C. for 1 minute to obtain a coating film (PNI-GF) for the photoimprint.

A quartz substrate was spin-coated with the imprint material PNI-H obtained in Comparative Example 8 and the resultant coating film was subjected to temporary baking on a hot plate of 100° C. for 1 minute to obtain a coating film (PNI-HF) for the photoimprint.

[Photoimprint]

As the imprint apparatus, NM-0801 HB (manufactured by Meisyo Kiko Co., Ltd.) was used. The coating film for the photoimprint prepared from each of the imprint materials obtained in Example 1 to Example 27 and Comparative Example 1 to Comparative Example 8 was subjected to patterning test. The used mold was made of silicon, and as the pattern, a 120 nm line and space was prepared. The mold was immersed in OPTOOL (registered trademark) HD (manufactured by Daikin Industries, Ltd.) beforehand and was subjected to treatment using a high temperature-high humidity apparatus in which the temperature was 90° C. and the humidity was 90 RH % for 2 hours, followed by being rinsed with pure water and then dried with air to be used.

The coating film for the photoimprint PNI-01F, which was prepared from the imprint material PNI-01 obtained in Example 1, and to which a silicon mold was adhered, was set in the above imprint apparatus. The photoimprint was performed under condition of 23° C. at all times and according to such a sequence as "a) pressurizing to 1,000 N over 10 seconds, b) exposing using a high pressure mercury lamp at 500 mJ/cm$^2$, c) depressurizing over 10 seconds, and d) separating the mold from the substrate to mold-release the substrate", and after mold-release, the coating film was baked in a clean oven (manufactured by Tabai Espec Corp.; PVHC-210) at 230° C. for 1 hour. The results after the photoimprint and after baking are listed in Table 1.

Also with respect to each of the coating films for the photoimprint prepared from the imprint materials obtained in Example 2 to Example 27 and Comparative Example 1 to Comparative Example 8, in the same manner as described above, the photoimprint and baking were performed. The results after the photoimprint and after baking are listed in Table 1.

TABLE 1

| | Coating film for photoimprint | State of pattern | | | Crack after baking |
|---|---|---|---|---|---|
| | | Photocuring | Peeling | Shape | |
| Example 1 | PNI-01F | ○ | ○ | ○ | ○ |
| Example 2 | PNI-02F | ○ | ○ | ○ | ○ |
| Example 3 | PNI-03F | ○ | ○ | ○ | ○ |
| Example 4 | PNI-04F | ○ | ○ | ○ | ○ |
| Example 5 | PNI-05F | ○ | ○ | ○ | ○ |
| Example 6 | PNI-06F | ○ | ○ | ○ | ○ |
| Example 7 | PNI-07F | ○ | ○ | ○ | ○ |
| Example 8 | PNI-08F | ○ | ○ | ○ | ○ |
| Example 9 | PNI-09F | ○ | ○ | ○ | ○ |
| Example 10 | PNI-10F | ○ | ○ | ○ | ○ |
| Example 11 | PNI-11F | ○ | ○ | ○ | ○ |
| Example 12 | PNI-12F | ○ | ○ | ○ | ○ |
| Example 13 | PNI-13F | ○ | ○ | ○ | ○ |
| Example 14 | PNI-14F | ○ | ○ | ○ | ○ |
| Example 15 | PNI-15F | ○ | ○ | ○ | ○ |
| Example 16 | PNI-16F | ○ | ○ | ○ | ○ |
| Example 17 | PNI-17F | ○ | ○ | ○ | ○ |
| Example 18 | PNI-18F | ○ | ○ | ○ | ○ |
| Example 19 | PNI-19F | ○ | ○ | ○ | ○ |
| Example 20 | PNI-20F | ○ | ○ | ○ | ○ |
| Example 21 | PNI-21F | ○ | ○ | ○ | ○ |
| Example 22 | PNI-22F | ○ | ○ | ○ | ○ |
| Example 23 | PNI-23F | ○ | ○ | ○ | ○ |
| Example 24 | PNI-24F | ○ | ○ | ○ | ○ |
| Example 25 | PNI-25F | ○ | ○ | ○ | ○ |
| Example 26 | PNI-26F | ○ | ○ | ○ | ○ |
| Example 27 | PNI-27F | ○ | ○ | ○ | ○ |
| Comparative Example 1 | PNI-AF | ○ | ○ | ○ | X |
| Comparative Example 2 | PNI-BF | ○ | ○ | ○ | X |
| Comparative Example 3 | PNI-CF | ○ | X | X | ○ |
| Comparative Example 4 | PNI-DF | ○ | X | X | ○ |
| Comparative Example 5 | PNI-EF | ○ | ○ | ○ | X |
| Comparative Example 6 | PNI-FF | ○ | ○ | ○ | X |
| Comparative Example 7 | PNI-GF | ○ | X | X | ○ |
| Comparative Example 8 | PNI-HF | ○ | X | X | ○ |

In Table 1, the column of "Photocuring" indicates evaluation of whether the film was cured after exposure, then "○" indicates that the film was cured and "X" indicates that the film was not cured. The column of "Peeling" indicates evaluation of whether a part of the pattern was peeled by, for example, being adhered to the mold during the mold-release, then "○" indicates that the pattern was not peeled and "X" indicates that there was observed peeling of the pattern. The column of "Shape" indicates evaluation of whether the pattern of the mold was advantageously transferred to the film after the mold-release, then "○" indicates that the pattern was advantageously transferred and "X" indicates that the pattern was not advantageously transferred. The column of "Crack after baking" indicates evaluation of whether a crack was caused in the film during natural cooling of the film after the film was baked after the photoimprint, then "○" indicates that there was not observed a crack and "X" indicates that there was observed a crack.

From the results in Table 1, each of the coating films for the photoimprint prepared from the imprint materials obtained in Example 1 to Example 27 could form an advantageous pattern by the photoimprint. On the other hand, in each of the coating films for the photoimprint prepared from the imprint materials obtained in Comparative Examples 1, 2, 5, and 6, there was caused a crack after baking of the film. In each of the coating films for the photoimprint prepared from the imprint materials obtained in Comparative Examples 3, 4, 7, and 8, a part of the pattern was peeled during mold-release of the film and the pattern of the mold was not advantageously transferred to the film after mold-release.

From the above results, it has become apparent that the constitution of the imprint material having crack resistance after baking of the coating film and capable of forming a desired pattern by the photoimprint essentially requires to contain the component (A): a compound having, in the molecule thereof, five or more polymerizable groups, the component (B): a compound having, in the molecule thereof, two polymerizable groups, and the component (C): a photo-radical generator. Furthermore, it has become apparent that the imprint material may also contain the component (D): a solvent and the component (E): a silicone compound having, in the molecule thereof, two or more polymerizable groups.

[Pencil Hardness Test]

The pencil hardness test was performed according to the method described in JIS K5600-5-4. As the tester, a motor-driven pencil scratch hardness tester No. 553-M (manufactured by Yasuda Seiki Seisakusho, LTD.) was used. In the pencil hardness test, the index of the hardness is indicated as "(hard) 9H>8H>7H>6H>5H>4H>3H>2H>H>F>HB>B>2B>3B>4B>5B>6B (soft)".

A silicon wafer was spin-coated with the imprint material PNI-01 obtained in Example 1 and the coating film was covered with a quartz substrate. Under a condition of 23° C. at all times and according to such a sequence as "a) pressurizing to 1,000 N over 10 seconds, b) exposing using a high pressure mercury lamp at 500 mJ/cm$^2$, c) depressurizing over 10 seconds, and d) separating the quartz substrate from the silicon wafer to mold-release the silicon wafer", a photocured film was prepared on the silicon wafer and the photocured film was baked in a clean oven at 230° C. for 1 hour and was then subjected to the pencil hardness test. The results thereof are listed in Table 2.

In the same manner as described above and using each of the imprint materials obtained in Example 2 to Example 12 and Example 25 to Example 27, the photocured film was prepared and was baked and then subjected to the pencil hardness test. The results thereof are listed in Table 2.

A silicon wafer was spin-coated with the imprint material PNI-13 obtained in Example 13 and the coating film was temporarily baked on a hot plate of 100° C. for 1 minute. The coating film was covered with a quartz substrate. Under a condition of 23° C. at all times and according to such a sequence as "a) pressurizing to 1,000 N over 10 seconds, b) exposing using a high pressure mercury lamp at 500 mJ/cm$^2$, c) depressurizing over 10 seconds, and d) separating the quartz substrate from the silicon wafer to mold-release the silicon wafer", a photocured film was prepared on the silicon wafer and the photocured film was baked in a clean oven at 230° C. for 1 hour and was then subjected to the pencil hardness test. The results thereof are listed in Table 2.

In the same manner as described above and using each of the imprint materials obtained in Example 14 to Example 24, the photocured film was prepared and was baked and then subjected to the pencil hardness test. The results thereof are listed in Table 2.

A silicon wafer was spin-coated with the imprint material PNI-A obtained in Comparative Example 1 and the coating film was covered with a quartz substrate. Under a condition of 23° C. at all times and according to such a sequence as "a) pressurizing to 1,000 N over 10 seconds, b) exposing using a high pressure mercury lamp at 500 mJ/cm$^2$, c) depressurizing over 10 seconds, and d) separating the quartz substrate from the silicon wafer to mold-release the silicon wafer", a photocured film was prepared on the silicon wafer and the photocured film was baked in a clean oven at 230° C. for 1 hour. At this time, a crack was caused in the film, so that the coating film could not be obtained.

In the same manner as described above, except that the imprint material PNI-B obtained in Comparative Example 2 was used instead of the imprint material PNI-A, a photocured film was prepared and was baked. However, after baking, a crack was caused in the film, so that the coating film could not be obtained.

In the same manner as described above and using each of the imprint materials obtained in Comparative Example 3 and Comparative Example 4, the photocured film was prepared and was baked and then subjected to the pencil hardness test. The results thereof are listed in Table 2.

A silicon wafer was spin-coated with the imprint material PNI-E obtained in Comparative Example 5 and the coating film was temporarily baked on a hot plate of 100° C. for 1 minute. The coating film was covered with a quartz substrate. Under a condition of 23° C. at all times and according to such a sequence as "a) pressurizing to 1,000 N over 10 seconds, b) exposing using a high pressure mercury lamp at 500 mJ/cm$^2$, c) depressurizing over 10 seconds, and d) separating the quartz substrate from the silicon wafer to mold-release the silicon wafer", a photocured film was prepared on the silicon wafer and the photocured film was baked in a clean oven at 230° C. for 1 hour. At this time, a crack was caused in the film, so that the coating film could not be obtained.

In the same manner as described above, except that the imprint material PNI-F obtained in Comparative Example 6 was used instead of the imprint material PNI-E, a photocured film was prepared and was baked. However, after baking, a crack was caused in the film, so that the coating film could not be obtained.

In the same manner as described above and using each of the imprint materials obtained in Comparative Example 7 and Comparative Example 8, the photocured film was prepared and was baked and then subjected to the pencil hardness test. The results thereof are listed in Table 2.

TABLE 2

|  | Imprint material | Pencil hardness |
| --- | --- | --- |
| Example 1 | PNI-01 | 4H |
| Example 2 | PNI-02 | 3H |
| Example 3 | PNI-03 | 3H |
| Example 4 | PNI-04 | 4H |
| Example 5 | PNI-05 | 4H |
| Example 6 | PNI-06 | 4H |
| Example 7 | PNI-07 | 4H |
| Example 8 | PNI-08 | 4H |
| Example 9 | PNI-09 | 3H |
| Example 10 | PNI-10 | 4H |
| Example 11 | PNI-11 | 4H |
| Example 12 | PNI-12 | 4H |
| Example 13 | PNI-13 | 4H |
| Example 14 | PNI-14 | 3H |
| Example 15 | PNI-15 | 3H |
| Example 16 | PNI-16 | 4H |
| Example 17 | PNI-17 | 4H |
| Example 18 | PNI-18 | 3H |
| Example 19 | PNI-19 | 4H |
| Example 20 | PNI-20 | 4H |
| Example 21 | PNI-21 | 4H |
| Example 22 | PNI-22 | 4H |
| Example 23 | PNI-23 | 4H |
| Example 24 | PNI-24 | 3H |
| Example 25 | PNI-25 | 3H |
| Example 26 | PNI-26 | 3H |
| Example 27 | PNI-27 | 3H |

TABLE 2-continued

| | Imprint material | Pencil hardness |
|---|---|---|
| Comparative Example 1 | PNI-A | Unmeasurable (crack) |
| Comparative Example 2 | PNI-B | Unmeasurable (crack) |
| Comparative Example 3 | PNI-C | B |
| Comparative Example 4 | PNI-D | H |
| Comparative Example 5 | PNI-E | Unmeasurable (crack) |
| Comparative Example 6 | PNI-F | Unmeasurable (crack) |
| Comparative Example 7 | PNI-G | B |
| Comparative Example 8 | PNI-H | H |

From the results in Table 2, each of the imprint materials obtained in Example 1 to Example 27 could form a coating film having a pencil hardness of 3H or more. On the other hand, each of the imprint materials obtained in Comparative Examples 1, 2, 5, and 6 caused a crack after baking thereof and could not form the coating film. Each of the imprint materials obtained in Comparative Examples 3, 4, 7, and 8 had a pencil hardness of H or less. From the above results, the film obtained using the imprint material of the present invention becomes a film having a pencil hardness of 3H or more.

[Measurement of Transmittance]

The transmittance was measured using UV-2550 UV-VIS-IBLE SPECTROPHOTOMETER (manufactured by Shimadzu Corporation) and was measured as the transmittance with a sample film thickness of 2 µm at a wavelength of 400 nm.

A quartz substrate was spin-coated with the imprint material PNI-01 obtained in Example 1 and the coating film was covered with another quartz substrate. Under a condition of 23° C. at all times and according to such a sequence as "a) pressurizing to 1,000 N over 10 seconds, b) exposing using a high pressure mercury lamp at 500 mJ/cm$^2$, c) depressurizing over 10 seconds, and d) separating the covering quartz substrate from the covered quartz substrate to mold-release the covered quartz substrate", a photocured film was prepared on the quartz substrate and the photocured film was baked in a clean oven at 230° C. for 1 hour and was then subjected to the transmittance measurement. The results thereof are listed in Table 3.

In the same manner as described above and using each of the imprint materials obtained in Example 2 to Example 12 and Example 25 to Example 27, the photocured film was prepared and was baked and then subjected to the transmittance measurement. The results thereof are listed in Table 3.

A quartz substrate was spin-coated with the imprint material PNI-13 obtained in Example 13 and the coating film was temporarily baked on a hot plate of 100° C. for 1 minute. Then, the coating film was covered with another quartz substrate. Under a condition of 23° C. at all times and according to such a sequence as "a) pressurizing to 1,000 N over 10 seconds, b) exposing using a high pressure mercury lamp at 500 mJ/cm$^2$, c) depressurizing over 10 seconds, and d) separating the covering quartz substrate from the covered quartz substrate to mold-release the covered quartz substrate", a photocured film was prepared on the quartz substrate and the photocured film was baked in a clean oven at 230° C. for 1 hour and then subjected to the transmittance measurement. The results thereof are listed in Table 3.

In the same manner as described above and using each of the imprint materials obtained in Example 14 to Example 24, the photocured film was prepared and was baked and then subjected to the transmittance measurement. The results thereof are listed in Table 3.

A quartz substrate was spin-coated with the imprint material PNI-A obtained in Comparative Example 1 and the coating film was covered with another quartz substrate. Under a condition of 23° C. at all times and according to such a sequence as "a) pressurizing to 1,000 N over 10 seconds, b) exposing using a high pressure mercury lamp at 500 mJ/cm$^2$, c) depressurizing over 10 seconds, and d) separating the covering quartz substrate from the covered quartz substrate to mold-release the covered quartz substrate", a photocured film was prepared on the quartz substrate and the photocured film was baked in a dean oven at 230° C. for 1 hour. At this time, a crack was caused in the film, so that the coating film could not be obtained.

In the same manner as described above, except that the imprint material PNI-B obtained in Comparative Example 2 was used instead of the imprint material PNI-A, a photocured film was prepared and was baked. However, after baking, a crack was caused in the film, so that the coating film could not be obtained.

In the same manner as described above and using each of the imprint materials obtained in Comparative Example 3 and Comparative Example 4, the photocured film was prepared and was baked and then subjected to the transmittance measurement. The results thereof are listed in Table 3.

A quartz substrate was spin-coated with the imprint material PNI-E obtained in Comparative Example 5 and the coating film was temporarily baked on a hot plate of 100° C. for 1 minute. Then, the coating film was covered with another quartz substrate. Under a condition of 23° C. at all times and according to such a sequence as "a) pressurizing to 1,000 N over 10 seconds, b) exposing using a high pressure mercury lamp at 500 mJ/cm$^2$, c) depressurizing over 10 seconds, and d) separating the covering quartz substrate from the covered quartz substrate to mold-release the covered quartz substrate", a photocured film was prepared on the quartz substrate and the photocured film was baked in a clean oven at 230° C. for 1 hour. At this time, a crack was caused in the film, so that the coating film could not be obtained.

In the same manner as described above, except that the imprint material PNI-F obtained in Comparative Example 6 was used instead of the imprint material PNI-E, a photocured film was prepared and was baked. However, after baking, a crack was caused in the film, so that the coating film could not be obtained.

In the same manner as described above and using each of the imprint materials obtained in Comparative Example 7 and Comparative Example 8, the photocured film was prepared and was baked and then subjected to the transmittance measurement. The results thereof are listed in Table 3.

TABLE 3

| | Imprint material | Transmittance (%) |
|---|---|---|
| Example 1 | PNI-01 | 98% |
| Example 2 | PNI-02 | 98% |
| Example 3 | PNI-03 | 98% |
| Example 4 | PNI-04 | 98% |
| Example 5 | PNI-05 | 98% |
| Example 6 | PNI-06 | 98% |
| Example 7 | PNI-07 | 98% |
| Example 8 | PNI-08 | 98% |
| Example 9 | PNI-09 | 98% |

TABLE 3-continued

|  | Imprint material | Transmittance (%) |
|---|---|---|
| Example 10 | PNI-10 | 98% |
| Example 11 | PNI-11 | 98% |
| Example 12 | PNI-12 | 98% |
| Example 13 | PNI-13 | 98% |
| Example 14 | PNI-14 | 98% |
| Example 15 | PNI-15 | 98% |
| Example 16 | PNI-16 | 98% |
| Example 17 | PNI-17 | 98% |
| Example 18 | PNI-18 | 98% |
| Example 19 | PNI-19 | 98% |
| Example 20 | PNI-20 | 98% |
| Example 21 | PNI-21 | 98% |
| Example 22 | PNI-22 | 98% |
| Example 23 | PNI-23 | 98% |
| Example 24 | PNI-24 | 98% |
| Example 25 | PNI-25 | 98% |
| Example 26 | PNI-26 | 98% |
| Example 27 | PNI-27 | 98% |
| Comparative Example 1 | PNI-A | Unmeasurable (crack) |
| Comparative Example 2 | PNI-B | Unmeasurable (crack) |
| Comparative Example 3 | PNI-C | 98% |
| Comparative Example 4 | PNI-D | 98% |
| Comparative Example 5 | PNI-E | Unmeasurable (crack) |
| Comparative Example 6 | PNI-F | Unmeasurable (crack) |
| Comparative Example 7 | PNI-G | 98% |
| Comparative Example 8 | PNI-H | 98% |

From the results in Table 3, with respect to each of the imprint materials obtained in Example 1 to Example 27, it was confirmed that the obtained coating film achieved a high transmittance.

[Stripping (Peeling Property) Test]

The stripping (peeling property) test was performed by a method including: preparing a solution in which monoethanolamine and dimethylsulfoxide were mixed in a mass ratio of 70:30; heating the solution to 80° C.; and then immersing in the solution the coating film formed on a base material for 15 minutes to confirm whether peeling of the coating film from the base material was caused during the immersion. The coating film after the immersion was baked on a hot plate at 100° C. for 1 minute and the rate of residual film after the immersion was calculated according to the equation:

Rate of residual film=(Film thickness after immersion and subsequent baking at 100° C. for 1 minute)/(Film thickness before immersion).

A quartz substrate was spin-coated with each of the imprint materials obtained in Example 25 to Example 27 and the coating film was covered with another quartz substrate. Under a condition of 23° C. at all times and according to such a sequence as "a) pressurizing to 1,000 N over 10 seconds, b) exposing using a high pressure mercury lamp at 500 mJ/cm$^2$, c) depressurizing over 10 seconds, and d) separating the covering quartz substrate from the covered quartz substrate to mold-release the covered quartz substrate", a photocured film was prepared on the quartz substrate and the photocured film was baked in a clean oven at 230° C. for 1 hour and was then subjected to the peeling property test. The results thereof are listed in Table 4.

TABLE 4

|  | Imprint material | Peeling | Rate of residual film |
|---|---|---|---|
| Example 25 | PNI-25 | ○ | 99.9% |
| Example 26 | PNI-26 | ○ | 99.9% |
| Example 27 | PNI-27 | ○ | 99.9% |

In Table 4, the column "Peeling" indicates the evaluation of whether the film was peeled from the base material during the immersion, then "○" indicates that the film was not peeled and "X" indicates that the film was peeled. From the results in Table 4, each of the imprint materials obtained in Example 25 to Example 27 containing the component (E) was not peeled from the base material and could form a coating film having a high rate of residual film.

INDUSTRIAL APPLICABILITY

The film obtained from the imprint material of the present invention can be suitably applied to semiconductor elements such as field effect transistor, electronic devices such as solid-state image sensors, and image display devices and optical members.

The invention claimed is:

1. An imprint material comprising:
   a component (A);
   a component (B); and
   a component (C),
      the component (A) being a compound having, in molecule thereof, five or more polymerizable groups, and including dipentaerythritol hexaacrylate or dipentaerythritol hexamethacrylate,
      the component (B) being at least one compound selected from the group consisting of neopentyl glycol diacrylate, ethanediol dimethacrylate, and a mixture thereof, and
      the component (C) being a photo-radical generator,
   wherein
      the imprint material comprises 10 to 30 parts by mass of the component (A) and 90 to 70 parts by mass of the component (B), relative to 100 parts by mass of the total of the component (A) and the component (B), and
      a content of the component (C) is 1 phr to 20 phr based on the total mass of the component (A) and the component (B).

2. The imprint material according to claim 1, further comprising a solvent as a component (D).

3. The imprint material according to claim 1, further comprising a silicone compound having, in molecule thereof, two or more polymerizable groups as a component (E).

4. The imprint material according to claim 1, wherein the component (A) is a compound having, as a polymerizable group, at least one organic group selected from the group consisting of an acryloyloxy group, a methacryloyloxy group, a vinyl group, and an allyl group.

5. A film prepared from the imprint material as claimed in claim 1 to which a pattern is transferred.

6. An optical member comprising the film to which a pattern is transferred as claimed in claim 5, on a base material.

7. A solid-state image sensor comprising the film to which a pattern is transferred as claimed in claim 5, on a base material.

8. A semiconductor device comprising the film to which a pattern is transferred as claimed in claim 5, on a base material.

9. An image display device comprising the film to which a pattern is transferred as claimed in claim 5, on a base material.

10. An electronic device comprising the film to which a pattern is transferred as claimed in claim 5, on a base material.

* * * * *